United States Patent
Jeong (10) Patent No.: US 7,408,777 B2
(45) Date of Patent: Aug. 5, 2008

(54) PLASMA DISPLAY DEVICE

(75) Inventor: Kwang Jin Jeong, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/440,784

(22) Filed: May 24, 2006

(65) Prior Publication Data

US 2006/0268510 A1 Nov. 30, 2006

(30) Foreign Application Priority Data

May 25, 2005 (KR) ............... 10-2005-0044027

(51) Int. Cl.
*H05K 7/20* (2006.01)
*F28D 15/00* (2006.01)
*G09G 3/28* (2006.01)

(52) U.S. Cl. .............. 361/704; 361/709; 361/710; 361/718; 165/104.33; 165/185; 174/16.3; 345/60; 348/748

(58) Field of Classification Search ......... 361/694–695, 361/704, 707, 709–710, 718–719; 165/185, 165/80.3, 104.33; 257/722; 174/16.3; 313/46, 313/582; 345/60, 905; 348/748; 349/161
See application file for complete search history.

(56) References Cited

U.S. PATENT DOCUMENTS

| 4,541,004 | A | * | 9/1985 | Moore | 257/706 |
| 4,611,238 | A | * | 9/1986 | Lewis et al. | 257/722 |
| 4,682,651 | A | * | 7/1987 | Gabuzda | 165/80.3 |
| 4,715,438 | A | * | 12/1987 | Gabuzda et al. | 165/185 |
| 4,733,293 | A | * | 3/1988 | Gabuzda | 257/697 |
| 4,753,290 | A | * | 6/1988 | Gabuzda | 165/185 |
| 4,823,869 | A | * | 4/1989 | Arnold et al. | 165/185 |
| 5,582,240 | A | * | 12/1996 | Widmayer | 165/80.3 |
| 5,673,177 | A | * | 9/1997 | Brodsky et al. | 361/704 |
| 5,828,551 | A | * | 10/1998 | Hoshino et al. | 361/697 |
| 6,176,299 | B1 | * | 1/2001 | Hanzlik et al. | 165/80.3 |
| 6,199,624 | B1 | * | 3/2001 | Wotring | 165/80.3 |

(Continued)

FOREIGN PATENT DOCUMENTS

CN 2212836 Y 11/1995

(Continued)

OTHER PUBLICATIONS

Patent Abstracts of Japan, Publication No. 2004-126151, dated Apr. 22, 2004, in the name of Manabu Akagi.

(Continued)

*Primary Examiner*—Jayprakash N Gandhi
*Assistant Examiner*—Robert J Hoffberg
(74) *Attorney, Agent, or Firm*—Christie, Parker & Hale, LLP (57) ABSTRACT

A plasma display device for keeping cooling efficiency of the device uniform between both horizontal and vertical positions. The plasma display device, which has a plasma display panel and a circuit unit for supplying a driving signal to the panel, includes a cavity-type heat dissipator having a plate which is located near a portion of the circuit unit to dissipate heat generated at the circuit unit, and wings which are affixed to the plate and extend from the edges of the plate inward.

10 Claims, 7 Drawing Sheets

U.S. PATENT DOCUMENTS

| | | | |
|---|---|---|---|
| 6,275,220 B1 * | 8/2001 | Nitta | 345/204 |
| 6,418,020 B1 * | 7/2002 | Lin | 361/703 |
| 6,446,708 B1 * | 9/2002 | Lai | 165/80.3 |
| 6,498,395 B2 * | 12/2002 | Baek et al. | 257/722 |
| 6,942,025 B2 * | 9/2005 | Nair et al. | 165/185 |
| 7,059,388 B2 * | 6/2006 | Chang | 165/80.3 |
| 7,213,636 B2 * | 5/2007 | Bhatti et al. | 165/80.4 |
| 2003/0007867 A1 * | 1/2003 | Chang | 415/220 |
| 2004/0190257 A1 * | 9/2004 | Chang | 361/703 |

FOREIGN PATENT DOCUMENTS

| | | | |
|---|---|---|---|
| CN | 267451 Y | | 1/2005 |
| JP | 04366528 A | * | 12/1992 |
| JP | 11083355 A | * | 3/1999 |
| JP | 2004-126151 | | 4/2004 |
| KR | 91-002301 | | 4/1991 |
| KR | 2003073422 A | * | 9/2003 |
| KR | 10-2005-0011844 | | 1/2005 |
| WO | WO 88/00394 | | 1/1988 |

OTHER PUBLICATIONS

CN Office action dated Feb. 29, 2008, with English translation, for corresponding Chinese Patent Application No. 2006100830027; indicating the relevance of the cited references, and JP 2004-126151 cited in an IDS dated May 6, 2008.

* cited by examiner

FIG.1A

(PRIOR ART)

PLASMA DISPLAY DEVICE

CROSS-REFERENCE TO RELATED APPLICATION

This application claims priority to and the benefit of Korean Patent Application No. 10-2005-0044027, filed on May 25, 2005, in the Korean Intellectual Property Office, the entire content of which is incorporated herein by reference.

BACKGROUND OF THE INVENTION

1. Field of the Invention

The present invention relates to a plasma display device, and more particularly, to a plasma display device which maintains cooling efficiency of the device displaying in one position uniform with the cooling efficiency in another position when the plasma display device is rotated from the first position to the other.

2. Description of Related Art

Various flat display devices have been developed as substitutes for cathode ray tube (CRT) display devices. The flat display devices developed include, for example, liquid crystal display (LCD) devices, electroluminescence display (ELD) devices, field emission display (FED) devices, and plasma display panels (PDPs) which may also be referred to as plasma display devices.

The PDP displays an image using visible rays emitted when gas discharge is generated in a panel. A plurality of electrodes are formed on the panel of the PDP, and driving circuits for supplying driving signals to the electrodes are formed on printed circuit boards provided on a rear surface of the PDP.

A data driving unit, a scan driving unit, a sustain driving unit, a power supply unit, and a control circuit unit are typically separately formed on several printed circuit boards according to function or location.

Generally, the aforementioned driving units are separately formed on several printed circuit boards. The scan driving unit and the sustain driving unit may be formed on the same board. That is, the printed circuit boards include driving unit boards on which the data driving unit, the scan driving unit, and the sustain driving unit are formed, a board on which a power supply unit for supplying a voltage for generating driving signals is formed, and a board on which a control circuit unit for controlling the driving units and the power supply unit and processing external data is formed.

On the boards where the driving units are formed, at least one intelligent power module (IPM) separate from the power supply unit is mounted. The IPM converts a DC voltage supplied from the power supply unit into a signal voltage by controlling the driving unit. That is, the IPM converts the DC voltage into a voltage having a different level or inverts the polarity of the DC voltage to generate a signal voltage required for driving the PDP.

During operation, the IPM generates a large amount of heat in the PDP. This is because potentials of driving waveforms for driving the PDP are much higher and the number of the applied waveforms is much greater than those of the other display devices. When a subfield is divided into an address period, a reset period, and a sustain period, reset discharge, address discharge, and sustain discharge are generated during each period. The sustain discharge is generated up to a maximum of 128 times during one subfield and a magnitude of the signal voltage for generating each one discharge is several tens of volts to several hundreds of volts. The address discharge is generated by applying address signals having different polarities to two electrodes, and a difference between address signal voltages applied to the two electrodes reaches several hundreds of volts. Because such high voltage driving signals are applied several tens of times in one second, the IPM for generating the driving signals is designed to endure such a load.

When heating elements, or heat generating elements, such as the IPM can not efficiently dissipate the heat they generate, the heating elements deteriorate, are damaged, or the signals are distorted and thus the PDP can not operate normally. Accordingly, to dissipate the heat generated at the heating elements, a cooling means such as a heat sink is attached to one side of the IPM.

Figure 1A:
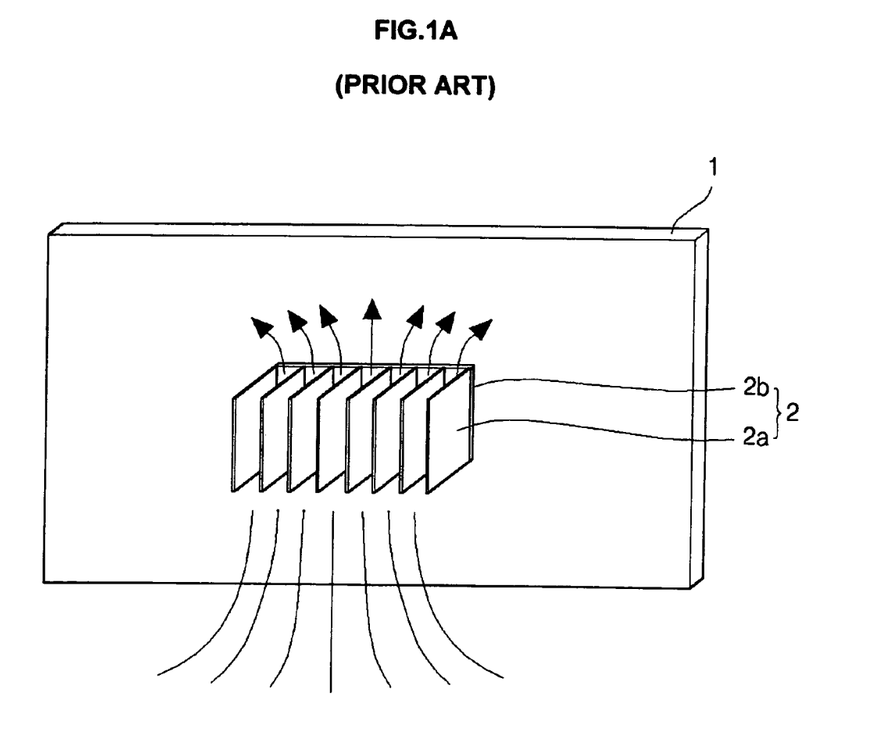
FIG. 1A illustrates arrangement of a conventional heat dissipator and a corresponding air flow.
Figure 1B:
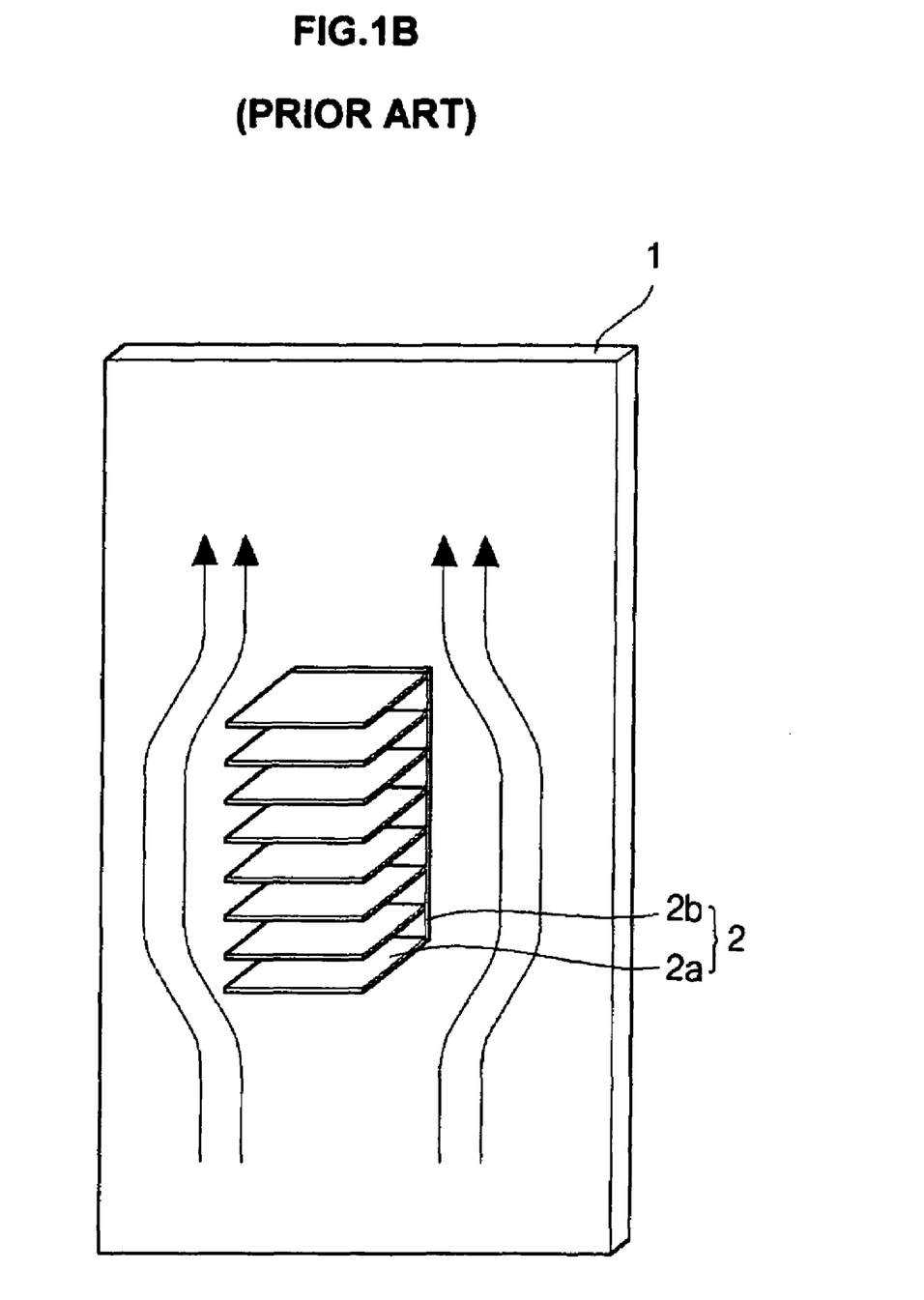
FIG. 1B illustrates the conventional heat dissipator and a corresponding air flow when the PDP of FIG. 1A is rotated by 90 degree.

FIGS. 1A and 1B illustrate a conventional heat dissipator or heat dissipating element used in a conventional PDP 1. FIG. 1A illustrates arrangement of a conventional heat dissipator 2 and a corresponding air flow. FIG. 1B illustrates the heat dissipator 2 and a corresponding air flow when the PDP 1 is rotated by 90 degree.

The conventional PDP 1 is said to be mounted in a horizontal position when a horizontal side is longer than its vertical side. Conversely, the PDP is said to be mounted in a vertical position when the vertical side of the PDP is longer than its horizontal side. FIG. 1A schematically illustrates the arrangement of the heat dissipator 2 of the PDP 1 and does not illustrate other structures of the PDP 1. The heat dissipator 2 includes wings 2a and plate 2b. When the PDP 1 is mounted as shown in FIG. 1A, the heat dissipator 2 mounted in a heating portion, such as the IPM, is such that the wings 2a extend in a vertical direction. Air flows between the wings 2a of the heat dissipator 2 to cool the heat dissipator 2. This structure can increase the cooling efficiency using air convection, and is made in consideration of the convective circulation that occurs due to air density difference. In contrast, when the wings 2a extend in the horizontal direction, the cooling efficiency is remarkably reduced.

As shown in FIG. 1B, when the wings 2a of the heat dissipator 2 extend perpendicular to the air flow direction, all but the lowest wing have very low contact ratios with the flowing air and thus it is difficult to efficiently dissipate the heat.

PDP products that can be used in both horizontal and vertical positions, shown respectively in FIGS. 1A and 1B, have recently come into the market. Accordingly, a conventional PDP, which is normally used in the horizontal position, can also be used in the vertical position by rotating the PDP by 90 degree. A PDP which can display in both the horizontal and the vertical positions is known as a PDP having a pivot function.

However, the PDPs having the pivot function also have the cooling problem described with reference to FIGS. 1A and 1B. That is, because the heat dissipator mounted on the printed circuit board is fixed to the heating portion and the wings are fixed in one direction, when the PDP is rotated using the pivot function, the wings of the fixed heat dissipator extend perpendicular to the air convection direction. Therefore, when the conventional PDP 1 uses the pivot function, the cooling efficiency is remarkably reduced in one of the vertical or horizontal positions and thus the elements frequently malfunction or are damaged.

SUMMARY OF THE INVENTION

The present invention provides a plasma display device which prevents a reduction in cooling efficiency when the plasma display device is rotated. For example, the embodiments of the present invention maintain the cooling efficiency of the plasma display device operating in a horizontal position uniform with the cooling efficiency when the device is rotated to operate in the vertical position.

One embodiment of the present invention provides a plasma display device having a plasma display panel and a circuit unit for supplying a driving signal to the panel and including a cavity-type heat dissipator having a plate which is formed at a predetermined portion of the circuit unit to dissipate heat generated at the circuit unit, and wings which stand on the plate and extend from the edges or sides of the plate inward.

The circuit unit may include a power supply unit which supplies a signal voltage for generating the driving signal, and a connecting member which connects the circuit unit with the panel and on which a driving chip for transferring the driving signal is mounted. Also, the predetermined portion may be the power supply unit, the connecting member, or both. In addition, the plate may contact the driving chip.

In one embodiment, the wings may be formed such that the lengths of the wings formed at center portions of the sides are greater than the lengths of the wings formed at corner portions of the sides. Length refers to a dimension substantially parallel to the plate.

In one embodiment, the wings may be formed such that the wings formed at center portions of the edges or sides have a first height and the wings formed at the corner portions have a second height. Height refers to a dimension substantially perpendicular to the plate. Further, at least one of the wings may be formed such that one portion of the wing is higher than another portion. The higher portion of the wing may be near a center portion of the heat dissipator.

The power supply unit may include at least one of a DC-AC converter and an intelligent power module. The connecting member may be a tape carrier package.

One embodiment presents a heat dissipator for a plasma display device that includes a plate formed near a heating element of the plasma display device and wings coupled to the plate and substantially perpendicular to the plate. The wings are located substantially transverse to edges of the plate and extend inward from the edges toward a cavity formed in a central portion of the plate. The plate may be rectangular, polygonal, or circular. The wings may be shorter near corners of the plate and longer near centers of sides of the plate or vice versa. The long and the short qualify a dimension substantially parallel to the plate. The wings may be lower near corners of the plate and higher near centers of sides of the plate or vice versa. The low and the high qualify a dimension substantially perpendicular to the plate. The wings may also be lower near the edges of the plate and higher near the central portion of the plate or vice versa. Longer and higher wings may be concentrated near the heat generation centers.

One embodiment provides a plasma display device including a plasma display panel, a circuit unit for supplying a driving signal to the plasma display panel, and a cavity-type heat dissipator. The cavity-type heat dissipator has a circuit unit interface adapted to be affixed to a predetermined portion of the circuit unit to dissipate heat generated at the circuit unit. The cavity-type heat dissipator also has wings protruding from the circuit unit interface that extend from edges of the circuit unit interface toward an interior area of the circuit unit interface.

One embodiment provides a heat dissipator for a plasma display device that includes a circuit unit interface adapted to be affixed to a heat generating element of the plasma display device and wings coupled to the circuit unit interface and protruding substantially perpendicular from the circuit unit interface. The wings are located substantially transverse to edges of the circuit unit interface and extend inwardly from edges of the circuit unit interface toward a cavity formed in a central portion of the plate.

DETAILED DESCRIPTION

Figure 2:
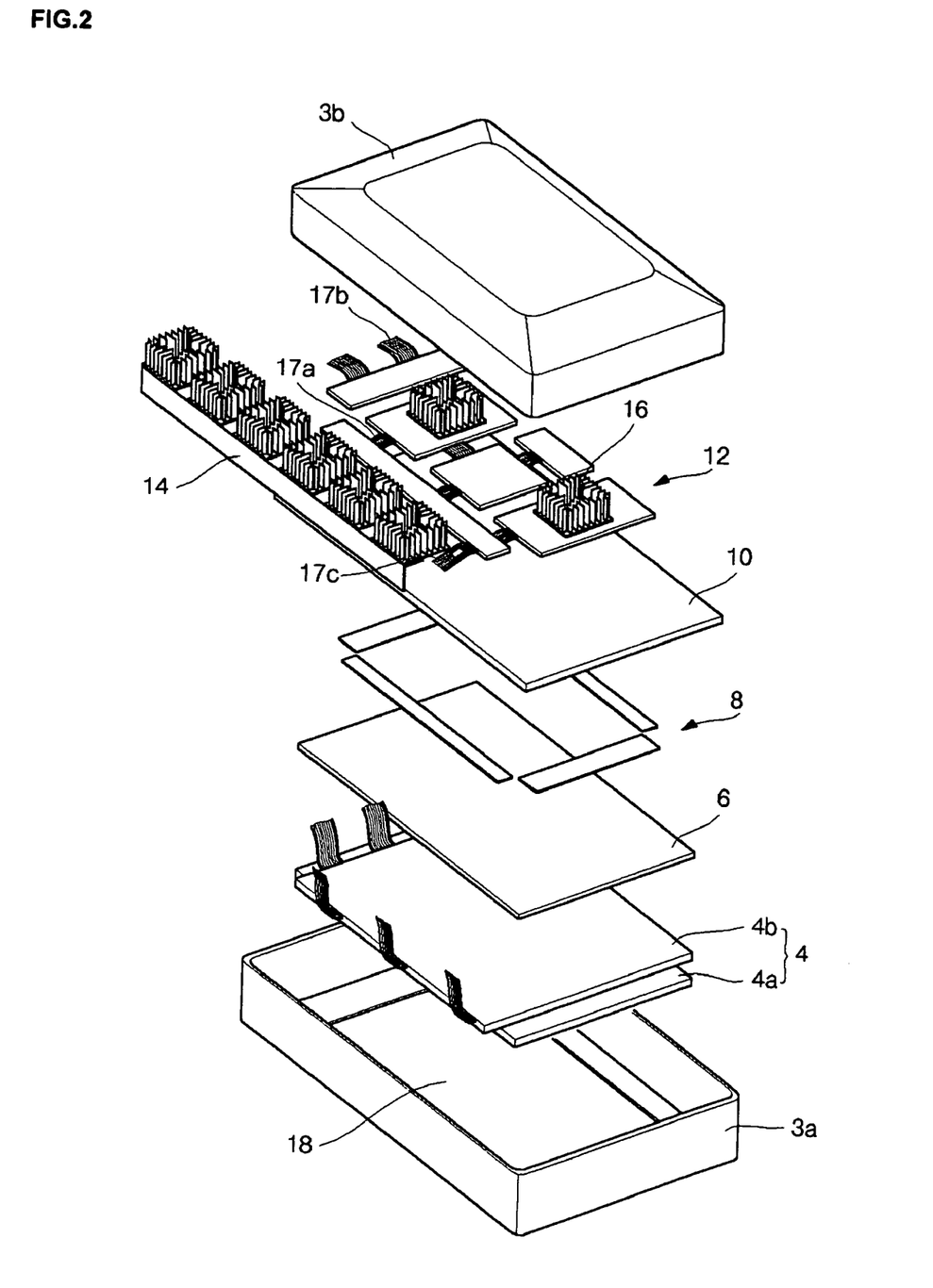
FIG. 2 illustrates an exploded perspective view of a plasma display device according to an embodiment of the present invention.

Referring to FIG. 2, the plasma display device of the invention includes a case, divided into a front case 3a and a rear case 3b, a panel 4, a heat conductive sheet 6, an adhesive member 8, a frame 10, printed circuit boards 12, and cavity-type heat dissipators 16.

The front case 3a is coupled to the rear case 3b such that the panel 4, the heat conductive sheet 6, the adhesive member 8, the frame 10, and the printed circuit boards 12 are contained in between the front and rear cases 3a, 3b and are protected from external impact or contamination. Also, the front case 3a has a light transmitting unit 18 for transmitting visible rays generated at the panel 4 and preventing noise generated during the operation of the PDP from being transferred to a viewer. Further, a filter assembly (not shown) may be interposed between the light transmitting unit 18 of the front case 3a and a front substrate 4a of the panel 4. The filter assembly includes a correction filter for absorbing a portion of the visible rays and correcting color, an electromagnetic interference filter for blocking electromagnetic waves generated in the PDP, and an anti-reflective film for preventing deterioration of image quality due to external light. The rear case 3b has a plurality of ventilation ports (not shown) for dissipating the heat.

The panel 4 displays an image by discharge which is generated by driving signals supplied from driving units formed on the printed circuit boards 12. Between the front and rear substrates 4a and 4b of the panel 4, partition walls, electrodes, phosphors, dielectric layers, and protective layers are located to form discharge cells where the discharge is generated. The discharge cells are filled with an inert gas for emitting ultraviolet rays having a wavelength for exciting the phosphors during discharge. The panel 4 is coupled to the driving units of the printed circuit boards 12 by connecting members such as flexible printed circuits (FPC) and tape carrier packages (TCP) on which driving chips are mounted. In addition, accessory members such as the adhesive member 8 and the heat conductive sheet 6 may be attached to a rear surface of the panel 4.

The heat conductive sheet 6 is located between the panel 4 and the frame 10 to transfer the heat generated at the panel 4 to the frame 10 or to dissipate the heat generated when driving the PDP, and consequently prevent a rapid increase in the temperature of the panel 4. The heat conductive sheet 6 makes temperature distribution uniform to prevent the panel 4 from malfunctioning or being damaged due to a local temperature difference. The method of attaching the heat conductive sheet 6 or the function of the heat conductive sheet 6 may vary depending on the material of the frame 10. For example, if the frame 10 is made of a material having good heat conduction and heat dissipation characteristics or properties, such as metal, the heat conductive sheet 6 is closely adhered to the frame 10. In this case, most of the heat generated at the panel 4 is transferred to the frame 10 through the heat conductive sheet 6 and a portion of the heat is dissipated by the heat conductive sheet 6. On the other hand, if the frame 10 is made of a material having poor heat conduction and dissipation characteristics, such as plastic, the heat conductive sheet 6 and the frame 10 are located apart leaving an interval in between. In this case, most of the heat generated at the panel 4 is dissipated by the heat conductive sheet 6 to maintain the temperature of the panel 4 uniform.

The adhesive member 8 fixes the heat conductive sheet 6 or the panel 4 to the frame 10. As shown in FIG. 2, the adhesive member 8 is formed at edges of the heat conductive sheet 6 in the shape of a band or a frame to fix the heat conductive sheet 6 or the panel 4 to the frame 10. The adhesive member 8 may be an adhesive, an adhesive sheet, or an adhesive tape. Thickness or shape of the adhesive member 8 or the method of attaching the adhesive member 8 may vary depending on the characteristics of the frame 10 material. As described above, if the frame 10 is made of the material having poor heat conduction or dissipation characteristics, the adhesive members 8 may be spaced apart from one another. Spacing the adhesive members 8 apart from one another allows air to be ventilated through the spaces between the adhesive members 8 to dissipate the heat from the heat conductive sheet 6. Also, when the adhesive member 8 directly adheres or attaches the panel 4 to the frame 10, gaps for ventilating the air may be formed by increasing the thickness of the adhesive member 8. When the frame 10 is made of the material having good heat conduction and dissipation characteristics, the adhesive member 8 is shaped to closely attach the heat conductive sheet 6 to the frame 10.

The frame 10 is coupled to the panel 4 or the heat conductive sheet 6 by the adhesive member 8. Depending on the type of its material, the frame 10 may dissipate the heat from the panel 4, the printed circuit board 12, and the TCP. The frame 10 supports and fixes the printed circuit boards 12 by a fastening means such as a boss or a screw. As described above, whether or not the frame 10 is closely attached or adhered to the heat conductive sheet 6 will depend on the type of the material of the frame 10. In addition, if the frame 10 is made of metal, a portion of the driving circuits which are formed on the printed circuit boards 12 may be used as a ground. Further, ear portions for fixing the front case 3*a* or the rear case 3*b* may be formed at edges or corners of the frame 10.

Circuit units for driving the PDP are formed on the printed circuit boards 12. The circuit units include a power supply unit for supplying a voltage, an address driving unit, a scan driving unit and a sustain driving unit for supplying the driving signals to the electrodes of the panel 4, and a control circuit unit for controlling the power supply unit and the driving units and processing external data. The printed circuit boards 12 are divided into several boards on which the circuit units are formed. Particularly, a DC-AC converter (not shown) is mounted in the power supply unit of the printed circuit boards 12, and intelligent power modules (IPMs) for generating the driving signals are mounted in the driving units. Also, a driving buffer board is mounted between each driving unit of the printed circuit boards 12 and the panel 4, and the driving signals of the driving units are supplied to the panel 4 through the driving buffer board. The scan driving unit and the sustain driving unit may be formed on the same board; in that case, they may share one driving buffer board. In addition, connecting members such as a flexible flat cable (FFC) 17*a*, a flexible printed circuit (FPC) 17*b*, and a tape carrier package (TCP) 17*c*, are provided between the panel 4 and the printed circuit boards 12 to transmit a signal or a voltage. Further, the cavity-type heat dissipators 16 are attached to the DC-AC converter and to the IPMs to dissipate the heat generated at the converter and the IPMs.

The connecting members 17*a*, 17*b*, 17*c* electrically connect the printed circuit boards 12 to the panel 4 and transmit the driving signals of the driving circuits to the panel 4. Among the different types of connecting members, flexible cables such as the FFC 17*a*, the FPC 17*b*, and the TCP 17*c* are primarily used. Particularly, in order to supply the driving signal to an address electrode of the panel 4, the TCP on which a driving chip is mounted is used. The TCP 17*c* is protected from external impact by a protective plate 14 shown in FIG. 2.

The protective plate 14 is fixed to the frame 10 to both protect the TCP 17*c* from external impact and fix the cavity-type heat dissipator 16 for dissipating the heat generated at the TCP 17*c*. A heat conductive medium layer (not shown) and a thermal grease layer (not shown) are formed between the protective plate 14 and the TCP 17*c* to efficiently receive the heat generated at the driving chip on the TCP 17*c*.

The cavity-type heat dissipators 16 dissipate the heat generated at the heating elements, or heat generating elements, such as the DC-AC converter, the IPMs, and the TCP 17*c* to prevent the temperatures of the heating elements from increasing and ensure normal operation of the elements. The cavity-type heat dissipators 16 are attached to an outer case of the DC-AC converter, surfaces of the IPMs, and the protective plate 14. Also, each of the cavity-type heat dissipators 16 is formed such that wings extend toward the inside of the cavity-type heat dissipators 16 to maintain the heat dissipation efficiency even in the case where the plasma display device is rotated by a predetermined angle.

Figure 3A:
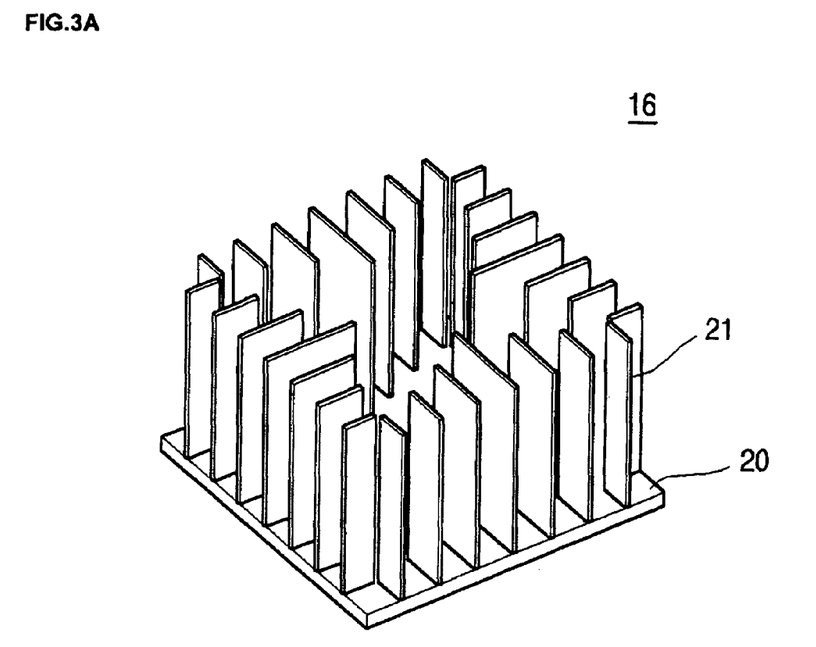
FIG. 3A is a perspective view of a cavity-type heat dissipator shown in FIG. 2.
Figure 3B:
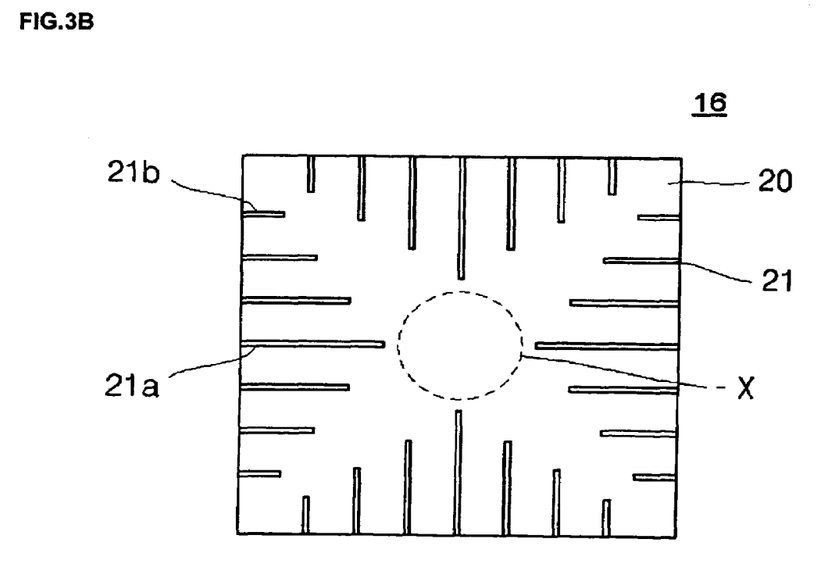
FIG. 3B is a plan view of the cavity-type heat dissipator shown in FIG. 3A.

FIG. 3A is a perspective view and FIG. 3B is a plan view of the cavity-type heat dissipator shown in FIG. 2.

The cavity-type heat dissipator 16 included in the plasma display device according to the embodiments of the present invention includes a plate 20 and wings 21 which stand on the plate 20. The plate 20 may also be referred to as the circuit unit interface.

The plate 20, or the circuit unit interface 20, contacts the heating element, receives the heat generated at the heating element, dissipates a portion of the heat, and transfers remaining heat to the wings 21. The plate 20 may be formed in a polygonal shape or a circular shape, depending on the shape or location of the heating element. Also, the plate 20 may receive the heat generated at the heating element through direct contact with the heating element or through the heat conductive medium layer or the thermal grease layer interposed between the heating element and the plate 20.

The wings 21 dissipate the heat which is transferred from the plate 20. The wings 21 stand on a surface of the plate 20. The wings 21 may be substantially vertical with respect to a plane of the plate 20. As shown in FIGS. 3A and 3B, the wings 21 extend toward the inside of the heat dissipator. For example, in the case of a rectangular plate 20, the wings 21 extend from one side of the plate 20 toward a facing side. The dimension of a wing that is substantially parallel to the plate is referred to as the length of the wing. In plan view, among the wings formed at one side, a wing 21a formed at a center portion of the side is longer than wings 21b formed at corner portions of the side. Also, a virtual cavity X, shown by a dotted circle in FIG. 3B, is formed whose center is located at a virtual intersection of the wings 21a formed at the center portions of the four sides. The same concepts may be extended to polygonal or circular plates where the appropriate degrees of rotation for a polygonal plate depends on the polygon and the circular plate may be rotated at any angle without loss of cooling efficiency.

Figure 4:
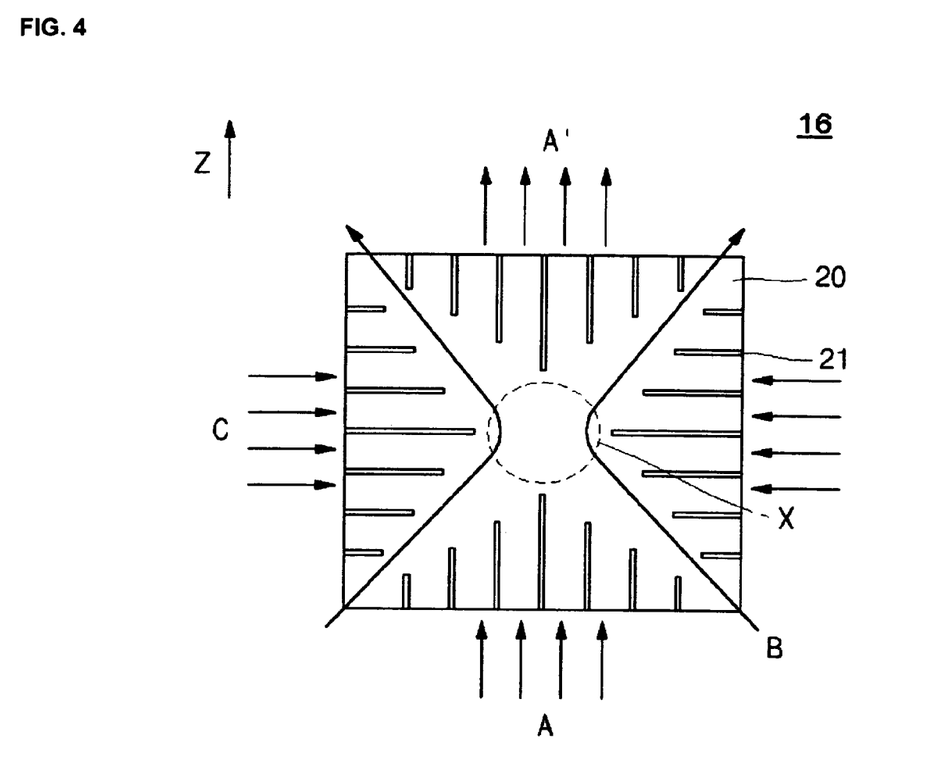
FIG. 4 illustrates the cavity-type heat dissipator of FIG. 2 and a corresponding air flow.

FIG. 4 schematically illustrates the cavity-type heat dissipator 16 and a corresponding air flow. In the cavity-type heat dissipator 16, the overall orientation of the wings 21 relative to a planar frame of reference remains the same when the heat dissipator 16 is rotated by multiples of 90 degrees. That is, while after a 90 degree rotation, a particular wing formerly extending along a first direction would lie along a second direction perpendicular to the first, another wing that was formerly along the second direction would now extend along the first direction such that, overall, the wings 21 will have the same directions after rotating the PDP by 90 degrees or 270 degrees.

A Z-direction shown in FIG. 4 is assumed to be the upward direction for a PDP that is, for example, hanging on a wall. When the PDP is driven, air convection occurs by the heat generated from the PDP and air flows from a lower side of the cavity-type heat dissipator 16 to an upper side through the wings 21. The air within the cavity-type heat dissipator 16 is heated by the operation of the PDP and the heated air flows upward and out of the dissipator 16. At this time, cooler air flows into the cavity-type heat dissipator 16 in an upward direction A and is heated by passing through the wings 21. Heated air has a lower density. The heated air having the reduced density flows in the upward direction (Z-direction) by convection. Convective air flow is similarly generated in the conventional heat dissipator. However, because the wings of a rotated conventional heat dissipator may extend perpendicular to the air flow direction, the heat dissipating efficiency of the conventional dissipator is remarkably lower.

In contrast, in the cavity-type heat dissipator 16 according to the embodiments of the present invention, the wings that are formed as shown in FIGS. 3A, 3B, and 4 do not extend perpendicular to the air flow direction even if the dissipator is rotated by multiples of 90 degrees.

Furthermore, the air which flows through the wings of the cavity-type heat dissipator 16 in directions A and B of FIG. 4 has a more rapid flow within the virtual cavity portion X formed in the center portion of the cavity-type heat dissipator 16. According to Bernoulli's theorem, pressure within the cavity portion X is reduced due to rapid air flow. When the pressure of the cavity portion X is reduced, cool air flows into the cavity portion X also through the wings formed in a direction C perpendicular to the air flow direction A. That is, air flows into the cavity portion X in the direction C as well as the direction A and thus the cooling efficiency increases. This effect can be obtained as long as the PDP is rotated by multiples of 90 degree.

Assuming that air is entering in an approximately vertical direction, the angle between the air flow direction and the wings does not exceed 45 degrees. Thus, in contrast to the conventional device described above, the air flow direction is not perpendicular to the wings and the cooling efficiency is not reduced by rotation of the PDP.

Figure 5A:
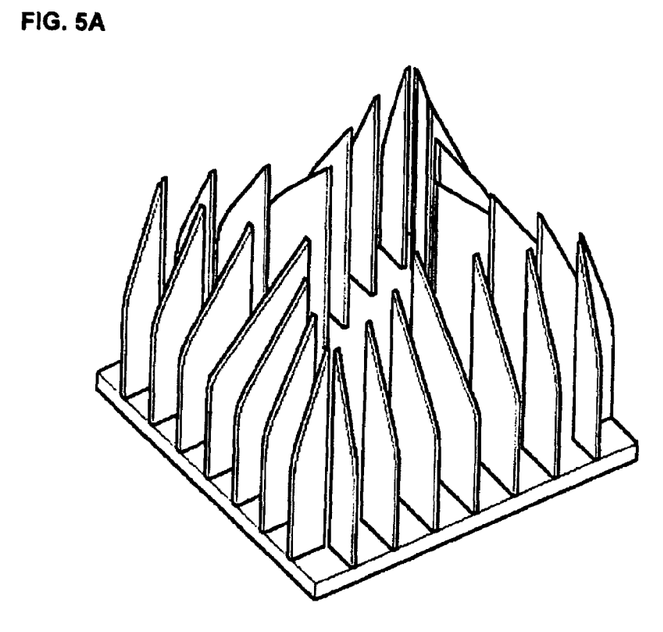
FIG. 5A illustrates a cavity-type heat dissipator having wings of gradually increasing heights toward a cavity portion.
Figure 5B:
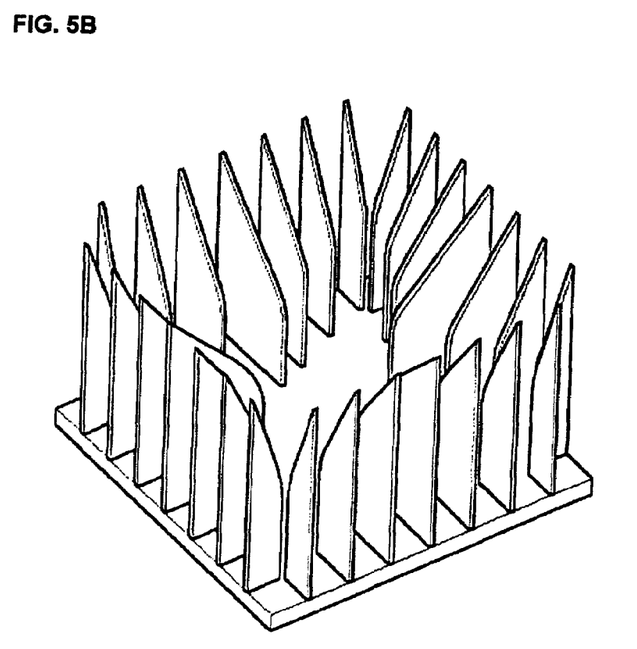
FIG. 5B illustrates a cavity-type heat dissipator having wings of gradually decreasing heights toward a cavity portion.
Figure 6A:
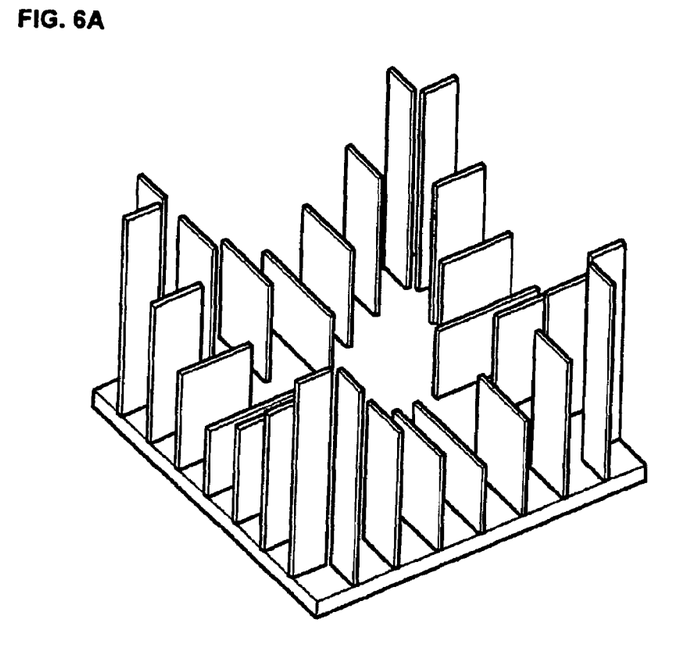
FIG. 6A illustrates a cavity-type heat dissipator in which the wings formed at the center of each of the sides have the lowest heights and the wings formed at the corners have the highest heights.
Figure 6B:
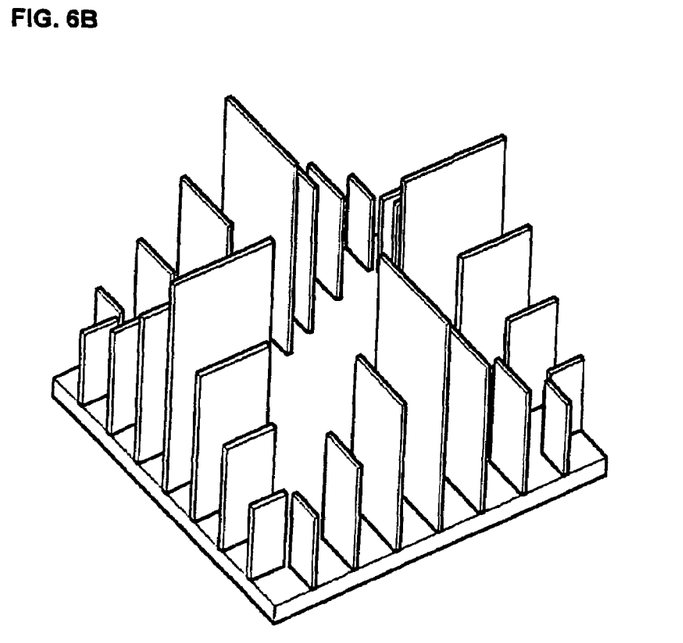
FIG. 6B illustrates a cavity-type heat dissipator in which the wings formed at the center of each of the sides have the highest heights and the wings formed at the corners have the lowest heights.

FIGS. 5A, 5B, 6A and 6B schematically illustrate other exemplary embodiments for wings of a cavity-type heat dissipator. Height of a wing refers to the wing dimension in the direction substantially perpendicular to the plate. FIG. 5A illustrates a cavity-type heat dissipator having wings whose heights gradually increase toward a cavity portion formed near a center of the dissipator. FIG. 5B illustrates a cavity-type heat dissipator having wings whose heights gradually decrease toward a cavity portion. FIG. 6A illustrates a cavity-type heat dissipator in which a wing formed at a center portion of each side has the lowest height and wings formed at corner portions have the highest height. FIG. 6B illustrates a cavity-type heat dissipator in which a wing formed at a center portion of each side has the highest height and wings formed at corner portions have the lowest height.

The cavity-type heat dissipator according to the embodiments of the present invention can be made in various shapes as shown in FIGS. 5A, 5B, 6A, and 6B. The cavity-type heat dissipator may be formed in a combination of the shapes shown in the figures or in another equivalent shape. Also, the plate is not limited to the rectangular shape and a square shape and may be formed in various shapes such as a circular shape or a polygonal shape.

The various shapes shown for the wings, increase the heat dissipating efficiency in various situations. In the examples shown, the heights of the wings gradually vary from the center portion of the heat dissipator, where the cavity portion X is also located, to the edge portions of the heat dissipator. The examples shown also indicate that among the wings formed at one side, the height of the wing formed at a center portion of the side is different from the heights of the wings formed at the corner portions of the side. The heat dissipating efficiency can be improved by increasing the height or the width of the wing located at a portion of the dissipator where most of the heat transferred from the heating element is concentrated. When the cavity-type heat dissipator 16 is attached to the heating element, typically, a large amount of heat is transferred to the center portion of the cavity-type heat dissipator 16 causing the center portion to have a relatively high temperature. Accordingly, in the embodiments shown in FIGS. 5A and 6B, the cavity-type heat dissipator is fabricated such that the wing of the center portion is higher.

As described above, the plasma display device according to the embodiments of the present invention includes the cavity-type heat dissipator having wings which extend toward the inside of the heat dissipator. Because the plasma display device of the present invention includes this cavity-type heat dissipator, the heating element can be efficiently cooled even when the plasma display device is rotated by a predetermined angle and the temperature of the heating element can be maintained in a normal operation range. Accordingly, element damage, signal distortion, and image quality deterioration due to excessive temperature increase of the heating element can be prevented.

While the present invention has been shown and described with reference to exemplary embodiments, it will be understood by those skilled in the art that various changes in form and details may be made without departing from the spirit and scope of the invention as defined by the appended claims and their equivalents.

What is claimed is:

1. A plasma display device comprising:
a plasma display panel having a planar viewing surface, the planar viewing surface having a rectangular perimeter;
a circuit unit for supplying a driving signal to the plasma display panel; and
a cavity-type heat dissipator having a circuit unit interface adapted to be affixed to a predetermined portion of the circuit unit to dissipate heat generated at the circuit unit, the cavity-type heat dissipator having wings protruding from the circuit unit interface,
wherein the wings extend from edges of the circuit unit interface toward an interior area of the circuit unit interface for forming at least two sets of air channels, each set of the air channels directing airflow across the circuit unit interface in directions parallel to the planar viewing surface while substantially perpendicular to an edge of the rectangular perimeter, and
wherein the at least two sets of air channels are substantially perpendicular to each other, and air channels within a set of the at least two sets of air channels are substantially parallel to each other.

2. The plasma display device of claim 1,
wherein one or more circuit units are coupled to the plasma display panel for supplying the driving signal to the plasma display panel; and
wherein the circuit unit interface is adapted to be affixed to a predetermined portion of a corresponding one or more circuit units to dissipate heat generated at the corresponding circuit unit.

3. The plasma display device of claim 2, wherein the one or more circuit units include:
printed circuit boards; and
connecting members coupling the printed circuit boards with the plasma display panel.

4. The plasma display device of claim 3, wherein the predetermined portion corresponds to at least one of the printed circuit boards.

5. The plasma display device of claim 1, wherein at least one of the wings is formed such that one portion of the wing protrudes further than other portions of the wing along a direction substantially perpendicular to the circuit unit interface.

6. The plasma display device of claim 5, wherein the one portion protruding further is near the edge of the circuit unit interface.

7. The plasma display device of claim 5, wherein the one portion protruding further is near the interior area of the circuit unit interface.

8. A plasma display device comprising:
a plasma display panel having a planar viewing surface, the planar viewing surface having a rectangular perimeter;
a circuit unit for supplying a driving signal to the plasma display panel; and
a cavity-type heat dissipator having a circuit unit interface adapted to be affixed to a predetermined portion of the circuit unit to dissipate heat generated at the circuit unit, the cavity-type heat dissipator having wings protruding from the circuit unit interface, each of the wings extending: from edges of the circuit unit interface toward an interior area of the circuit unit interface, and in directions parallel to the planar viewing surface while perpendicular to edges of the rectangular perimeter,
wherein the wings formed at center portions of the edges protrude further than the wings formed at corner portions of the edges along a direction substantially perpendicular to the circuit unit interface.

9. A plasma display device comprising:
a plasma display panel having a planar viewing surface, the planar viewing surface having a rectangular perimeter;
a circuit unit for supplying a driving signal to the plasma display panel; and
a cavity-type heat dissipator having a circuit unit interface adapted to be affixed to a predetermined portion of the circuit unit to dissipate heat generated at the circuit unit, the cavity-type heat dissipator having wings protruding from the circuit unit interface, each of the wings extending: from edges of the circuit unit interface toward an interior area of the circuit unit interface, and in directions parallel to the planar viewing surface while perpendicular to edges of the rectangular perimeter,
wherein the wings formed at center portions of the edges extend further from edges of the circuit unit interface toward the interior area of the circuit interface unit than the wings formed at corner portions of the edges.

10. A plasma display device comprising:
a plasma display panel having a planar viewing surface, the planar viewing surface having a rectangular perimeter;
a circuit unit for supplying a driving signal to the plasma display panel; and
a cavity-type heat dissipator having a circuit unit interface adapted to be affixed to a predetermined portion of the circuit unit to dissipate heat generated at the circuit unit, the cavity-type heat dissipator having wings protruding from the circuit unit interface, each of the wings extending: from edges of the circuit unit interface toward an interior area of the circuit unit interface, and in directions parallel to the planar viewing surface while perpendicular to edges of the rectangular perimeter,
wherein at least one of the wings is formed such that one portion of the wing protrudes further than other portions of the wing along a direction substantially perpendicular to the circuit unit interface, and
wherein the wings formed at center portions of the edges extend further from edges of the circuit unit interface toward the interior area of the circuit unit interface than the wings formed at corner portions of the edges.

* * * * *